US007053666B2

(12) United States Patent
Tak et al.

(10) Patent No.: US 7,053,666 B2
(45) Date of Patent: May 30, 2006

(54) PHASE FREQUENCY DETECTOR

(75) Inventors: Geum-Young Tak, Seoul (KR);
Seok-Bong Hyun, Daejeon (KR);
Kyung-Hwan Park, Daejeon-shi (KR);
Tae-Young Kang, Incheon-shi (KR);
Seong-Su Park, Daejeon-shi (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 0 days.

(21) Appl. No.: 11/023,379

(22) Filed: Dec. 29, 2004

(65) Prior Publication Data

US 2006/0055434 A1    Mar. 16, 2006

(30) Foreign Application Priority Data

Nov. 9, 2004    (KR) .................... 10-2004-0090672

(51) Int. Cl.
*G01R 25/00* (2006.01)
*H03D 13/00* (2006.01)

(52) U.S. Cl. ............................................. 327/3; 327/12
(58) Field of Classification Search .................... 327/3, 327/7, 12, 39, 40, 43, 47, 48, 49
See application file for complete search history.

(56) References Cited

U.S. PATENT DOCUMENTS

| | | | | |
|---|---|---|---|---|
| 5,317,283 A | * | 5/1994 | Korhonen | 331/1 A |
| 5,373,255 A | * | 12/1994 | Bray et al. | 331/1 A |
| 5,592,109 A | * | 1/1997 | Notani et al. | 327/3 |
| 5,661,419 A | * | 8/1997 | Bhagwan | 327/8 |
| 5,736,872 A | * | 4/1998 | Sharma et al. | 327/3 |

(Continued)

OTHER PUBLICATIONS

Mozhgan Mansuri, et al.; "Fast Frequency Acquisition Phase-Frequency Detectors for GSamples/s Phase-Locked Loops"; IEEE Journal of Solid-State Circuits, vol. 37, No. 10, Oct. 2003, pp. 1331-1334.

(Continued)

*Primary Examiner*—Quan Tra
*Assistant Examiner*—Rey Aranda
(74) *Attorney, Agent, or Firm*—Mayer, Brown, Rowe & Maw LLP

(57) ABSTRACT

Provided is a phase frequency detector for use in a phase locked loop (PLL) or a delay locked loop (DLL), the phase frequency detector including: an UP signal output unit having a first stage operated according to a reference clock delayed by a predetermined time and a reset signal, a second stage operated according to the reference clock and an output of the first stage, and an inverter for inverting an output of the second stage; a DOWN signal output unit having: a first stage operated according to an outer clock delayed by a predetermined time and the reset signal, a second stage operated according to the outer clock and an output of the first stage, and an inverter for inverting an output of the second stage; and a logic gate logically combining the output of the second stage of the UP signal output unit and the output of the second stage of the DOWN signal output unit to generate the reset signal, thereby a phase range of the input signal with which an effective control signal can be obtained is wide so that low power consumption and low noise characteristics can be obtained due to fast phase lock, low power consumption of a dynamic logic, and fast signal transmission.

9 Claims, 4 Drawing Sheets

U.S. PATENT DOCUMENTS

| | | | |
|---|---|---|---|
| 5,896,066 A * | 4/1999 | Katayama et al. | 331/17 |
| 5,963,058 A * | 10/1999 | Thomas | 327/3 |
| 6,037,806 A * | 3/2000 | Smith et al. | 327/47 |
| 6,157,263 A * | 12/2000 | Lee et al. | 331/25 |
| 6,831,485 B1 * | 12/2004 | Lee et al. | 327/2 |

OTHER PUBLICATIONS

Sungjoon Kim, et al.; "A 960-Mb/s/pin Interface for Skew-Tolerant Bus Using Low Jitter PLL"; IEEE Journal of Solid-State Circuits, vol. 32, No. 5, May 1997, pp. 691-700.

* cited by examiner

PHASE FREQUENCY DETECTOR

CROSS-REFERENCE TO RELATED APPLICATION

This application claims priority to and the benefit of Korean Patent Application No. 2004-90672, filed on Nov. 9, 2004, the disclosure of which is incorporated herein by reference in its entirety.

BACKGROUND

1. Field of the Invention

The present invention relates to a phase frequency detector for use in a phase locked loop (PLL) or a delay locked loop (DLL) and, more specifically, to a phase frequency detector capable of operating at a high frequency and having fast phase lock, low power consumption, and low noise characteristics.

2. Discussion of Related Art

A phase locked loop (hereinafter, referred to as PLL), which is a frequency feedback circuit that generates any frequency according to a predetermined clock signal, is used for a frequency synthesizer and a data processor, etc.

In general, the PLL includes a reference frequency generator, a voltage controlled oscillator (VCO), a frequency divider for dividing a frequency output from the VCO, a phase frequency detector (hereinafter, referred to as PFD) for receiving the reference frequency and the divided frequency to detect a phase, a charge pump for receiving a phase difference signal output from the PFD, and a loop filter for removing a high frequency component of a signal output from the charge pump. An output frequency of the VCO is controlled according to the voltage output through the loop filter.

The PFD receives the reference frequency and the divided frequency to output UP and DOWN signals. Here, the phase difference between two frequencies is represented by a difference of a pulse width of the UP and DOWN signals. When different frequencies are input, the frequency difference corresponds to a difference of the average pulse width of the UP and DOWN signals.

As shown in FIG. 1, the typical PFD includes flip-flops 1 and 2 for receiving a reference frequency clock CKref and a divided frequency clock CKout, respectively, to output the UP and DOWN signals; and a NAND gate 3 for logically combining the UP and DOWN signals to generate a reset signal for resetting the flip-flops 1 and 2.

Referring to FIG. 2, the UP signal becomes "1" at a rising edge of the reference frequency clock CKref and the DOWN signal becomes "1" at a rising edge of the divided frequency clock CKout. When both UP and DOWN signals become "1", the flip-flops 1 and 2 are reset by the output of the NAND gate 3 so that both UP and DOWN signals become "0". The UP signal which is the phase difference of the CKref and the CKout, is transferred to the charge pump so that the output frequency of the VCO is increased or decreased.

In the PFD used for the PLL, delay means is generally inserted into a reset path to prevent a dead zone such that certain duration pulses are simultaneously output through UP and DOWN signal output terminals when phases of two input clocks CKref and CKout are matched. The charge pump connected to the output stage of the PFD requires more than a certain number of duration pulses for an exact switching operation so that the extremely small delay means is not allowed in the reset path. Typically, a size of the delay means is typically determined such that the pulse duration time output through the UP and DOWN signal output terminals is 300 ps or more.

As the pulse duration output through the UP and DOWN signal output terminals become longer, $\Delta$ in FIG. 3 becomes larger. In this case, when the UP and DOWN signals are output in a reversed direction rather than the fixed direction, a time required for phase lock becomes longer. In addition, as the frequencies of the input clocks CKref and CKout become higher, a ratio of the pulse width for preventing the dead zone to the compared clock period becomes larger. Therefore, $\Delta$ becomes larger and the operation speed of the PFD reaches a limitation. When $\Delta$ is more than $\pi$, the phase lock is not guaranteed. [Ref. Mansuri M. etc. "Fast frequency acquisition phase-frequency detectors for Gsamples/s phase-locked loops", Solid-State Circuits, IEEE Journal of Vol. 37, pp 1331–1334, 2002. 10.].

Mansuri M. etc. proposed a phase frequency detector arranged as in FIG. 4 to improve the problems. FIG. 5 is a waveform showing the operation characteristics of the phase frequency detector shown in FIG. 4, which shows that the time for locking phase becomes shorter.

When a phase error is close to $2\pi$, pulses $P_{ref}$ and $P_{out}$ delayed by an inverter remain high during a predetermined time after a falling edge of the reset signal RST so that right UP and DOWN signals are output. When the predetermined time is t1, an ON current of transistors N1, N2, N3 or N4, N5, N6 connected in series should be sufficient to change a state of the latch to output the UP and DOWN signals as high states during t1 time. For the operation of the fast phase lock, the state of the latch should be changed even when t1 is extremely short. Therefore, channel widths of the transistors N1, N2, N3 or N4, N5, N6 should be large so that it is difficult to reduce power consumption.

SUMMARY OF THE INVENTION

The present invention is directed to a phase frequency detector capable of operating at a high frequency and having fast phase lock, low power consumption, and low noise characteristics.

One aspect of the present invention is to provide a phase frequency detector including: an UP signal output unit having a first stage operated according to a reference clock delayed by a predetermined time and a reset signal, a second stage operated according to the reference clock and an output of the first stage, and an inverter for inverting an output of the second stage; a DOWN signal output unit having: a first stage operated according to an outer clock delayed by a predetermined time and the reset signal, a second stage operated according to the outer clock and an output of the first stage, and an inverter for inverting an output of the second stage; and a logic gate logically combining the output of the second stage of the UP signal output unit and the output of the second stage of the DOWN signal output unit to generate the reset signal.

The first stage of the UP signal output unit includes: first and second transistors connected in series between a power supply voltage and an output node; and a third transistor connected between the output node and ground, and wherein the reset signal is input to gates of the first and third transistors, and the delayed reference clock is input to a gate of the second transistor.

The second stage of the UP signal output unit includes: a first transistor connected between a power supply voltage and an output node; and second and third transistors connected in series between the output node and ground, and wherein the reference clock is input to a gate of the second transistor, and gates of the first and third transistors are connected to the output node.

The phase frequency detector may further include: a fourth transistor connected between the output of the second stage and a connection of the second transistor and the third transistor, wherein the fourth transistor is operated according to the delayed reference clock.

The first stage of the DOWN signal output unit includes: first and second transistors connected in series between a power supply voltage and an output node; and a third transistor connected between the output node and ground, and wherein the reset signal is input to gates of the first and third transistors, and the delayed outer clock is input to a gate of the second transistor.

The second stage of the DOWN signal output unit includes: a first transistor connected between a power supply voltage and an output node; and second and third transistors connected in series between the output node and ground, and wherein the outer clock is input to a gate of the second transistor, and gates of the first and third transistors are connected to the output node.

The phase frequency detector may further include: a fourth transistor connected between the output of the second stage and a connection of the second transistor and the third transistor, wherein the fourth transistor is operated according to the delayed outer clock.

The predetermined time may be set to be shorter than a time from a rising edge of a later input clock between the reference clock and the outer clock to a falling edge of the reset signal.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

Exemplary embodiments of the present invention will now be described in detail with reference to the accompanying drawings. The following embodiments are provided for a thorough understanding to those skilled in the art, and a variety of modification can be made and the scope of the present invention is not limited to the embodiments described below.

Figure 6:
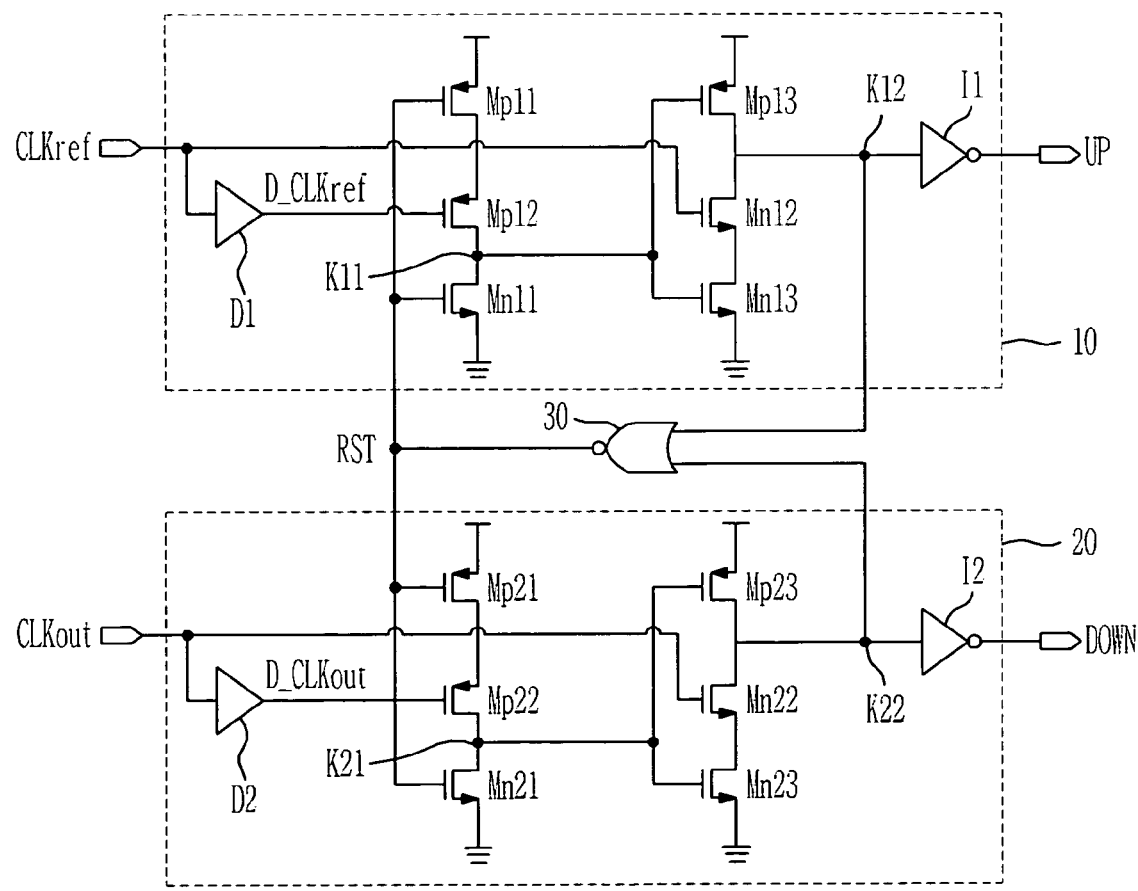
FIG. 6 is a circuit diagram for explaining a phase frequency detector according to a first embodiment of the present invention.

FIG. 6 is a circuit diagram for explaining a phase frequency detector according to a first embodiment of the present invention.

The phase frequency detector (PFD) of the present invention includes: an UP signal output unit 10 for receiving a reference clock CLKref and a predetermined time delayed reference clock D_CLKref; a DOWN signal output unit 20 for receiving an outer clock CLKout and a predetermined time delayed outer clock D_CLKout; and a logical gate for logically combining outputs of the UP signal output unit 10 and the DOWN signal output unit 20 to generate a reset signal RST.

The UP signal output unit 10 includes: a first stage operated according to the predetermined time delayed reference clock D_CLKref, delayed by delay means D1, and the reset signal RST; a second stage operated according to the reference clock CLKref and an output of the first stage; and an inverter I1 for inverting an output of the second stage.

The first stage includes transistors Mp11 and Mp12 connected in series between a power supply voltage Vcc and an output node K11 and a transistor Mn11 connected between the output node K11 and the ground, wherein the reset signal RST is input to gates of the transistors Mp1 and Mn11, and the predetermined time delayed reference clock D_CLKref is input to a gate of the transistor Mp12 through the delay means D1.

The second stage includes a transistor M13 connected between the power supply voltage Vcc and an output node K12 and transistors Mn12 and Mn13 connected in series between the output node K12 and the ground, wherein the reference clock CLKref is input to a gate of the transistor Mn12, and gates of the transistors Mp13 and Mn13 are connected to the output node K11.

The inverter I1 is connected between the output node K12 and the UP signal output terminal.

The DOWN signal output unit 20 includes: a first stage operated according to the predetermined time delayed outer clock D_CLKout, delayed through delay means D2, and the reset signal RST; a second stage operated according to the outer clock CLKout and an output of the first stage; and an inverter I2 for inverting an output of the second stage.

The first stage includes: transistors Mp21 and Mp22 connected in series between the power supply voltage Vcc and an output node K21; and a transistor Mn21 connected between the output node K21 and the ground, wherein the reset signal RST is input to gates of the transistors Mp21 and Mn21, and the predetermined time delayed outer clock D_CLKout is input to a gate of the transistor Mp22 through the delay means D2.

The second stage includes: a transistor Mp23 connected between the power supply voltage Vcc and an output node K22; and transistors Mn22 and Mn23 connected in series between the output node K22 and the ground, wherein the outer clock CLKout is input to a gate of the transistor Mn22, and gates of the transistors Mp23 and Mn23 are connected to the output node K21.

The inverter I2 is connected between the output node K22 and the DOWN signal output terminal.

The delay means D1 and D2 may include, for example, an even number of inverters, and the logic gate 30 may include, for example, a NOR gate to logically combine the signal output through the output nodes K12 and K22 to generate the reset signal RST.

Figure 5:
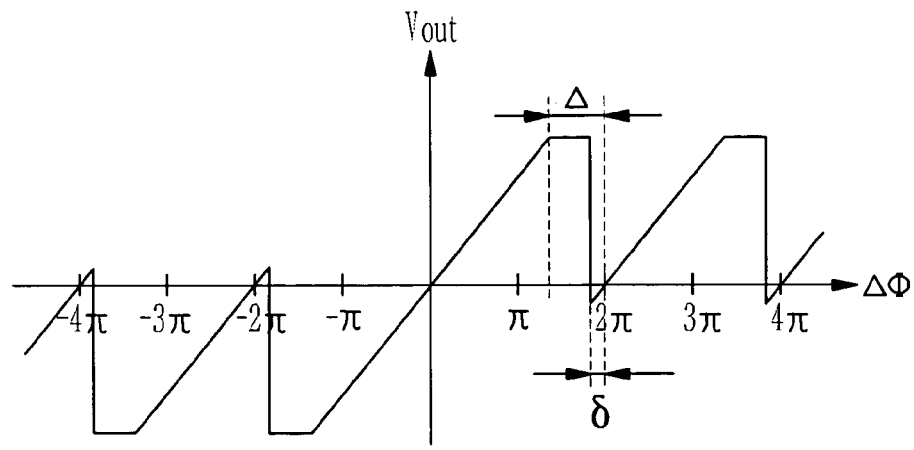
FIG. 5 is a waveform for explaining the operation characteristics of FIG. 4.

In the PFD of the present invention arranged as described above, the reference clock CLKref is delayed by td1 by the delay means D1, and in case of td1<td5, it has the operation characteristics as shown in FIG. 5. In other words, the delay time td1 is set to be shorter than a time td5 from a rising edge of the later input clock of the reference clock CLKref and the outer clock CLKout to a falling edge of the reset signal RST. Here, td1=td5−(δ/2π)/fclk and the smaller δ is preferable. However, it is desirable that td1 is determined to have some margin of δ in consideration of characteristics such as processing conditions and temperature.

Figure 1:
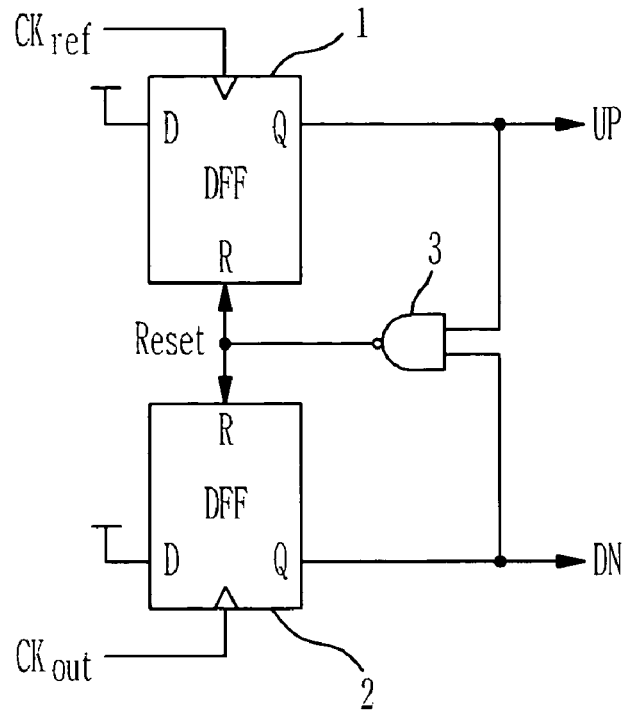
FIG. 1 is a circuit diagram for explaining a conventional phase frequency detector.
Figure 2:
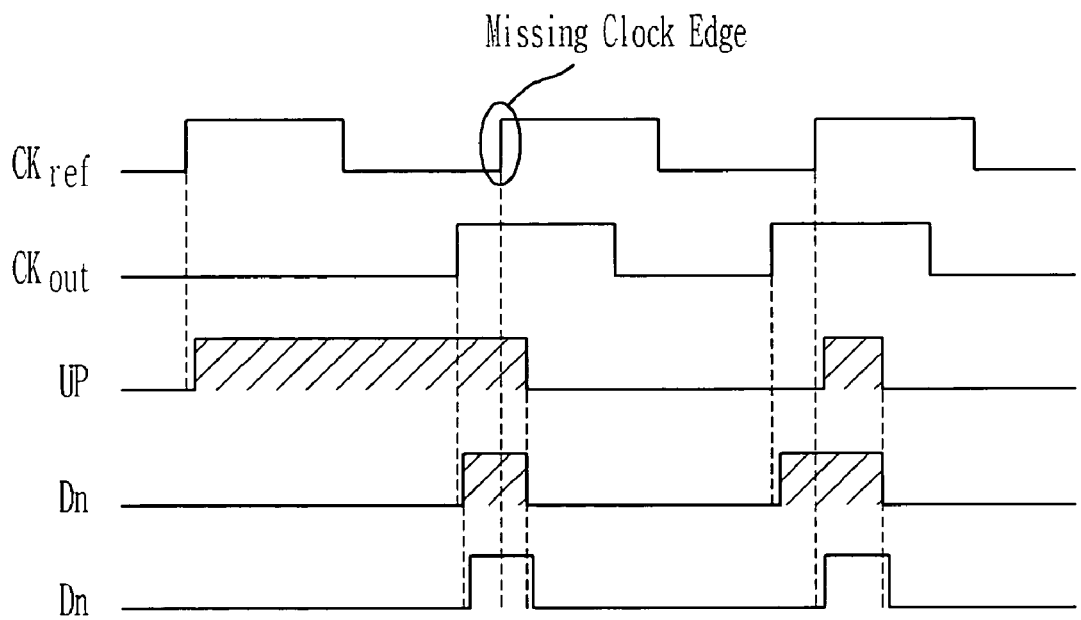
FIG. 2 is a timing diagram for explaining the operation of FIG. 1.
Figure 3:
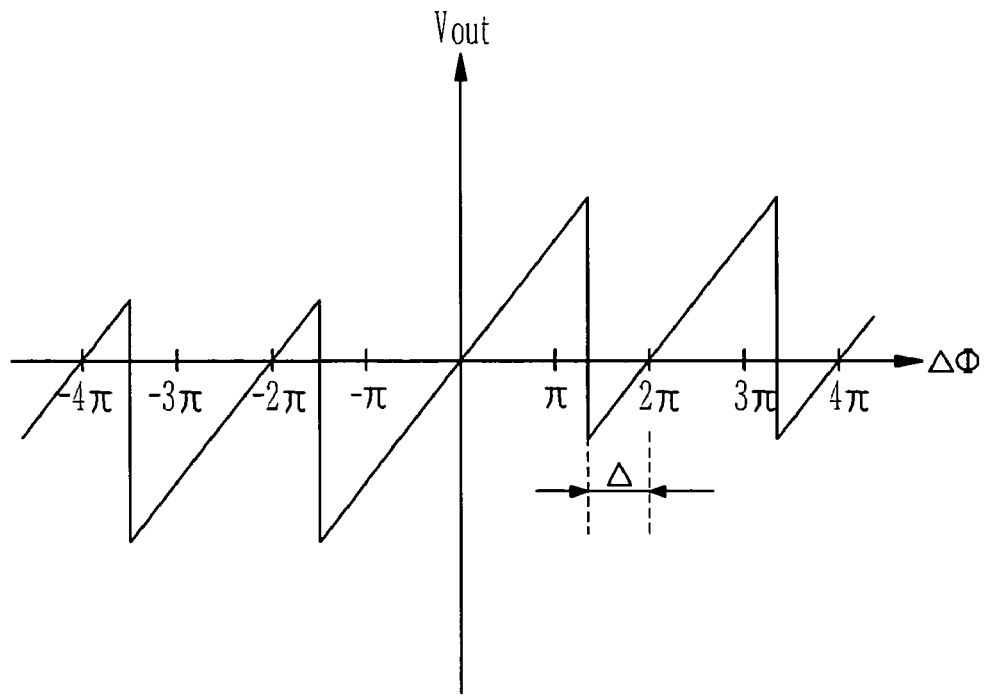
FIG. 3 is a waveform for explaining the operation characteristics of FIG. 1.
Figure 7:
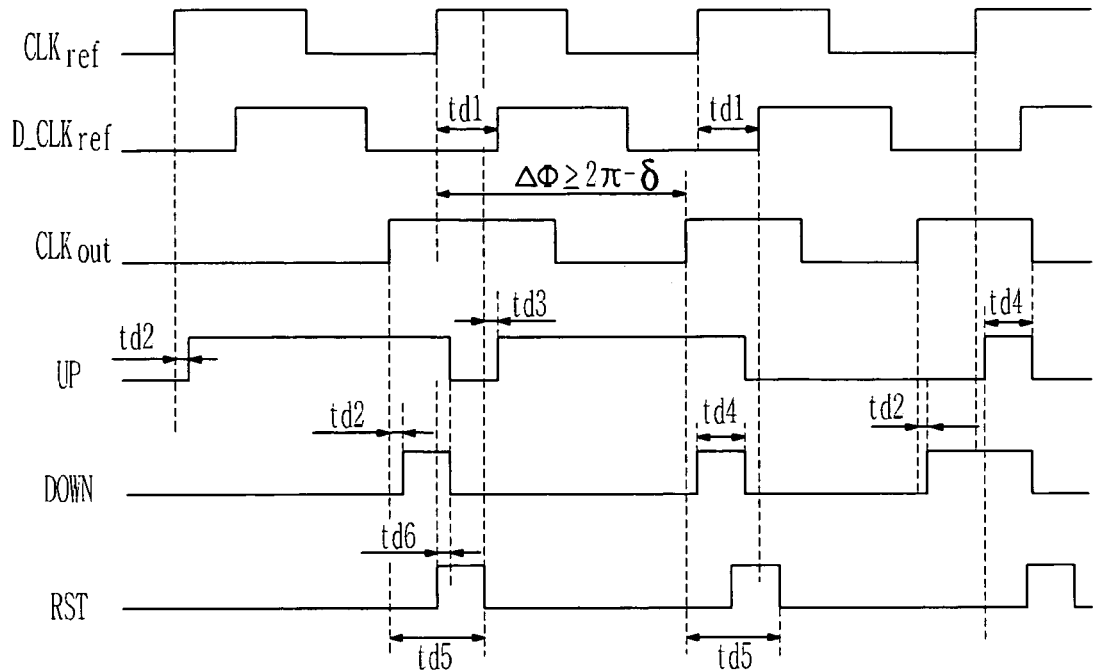
FIG. 7 is a timing diagram for explaining the operation of FIG. 6.

Referring to FIG. 7, td2 refers to a delay time taken from the gate of the transistor Mn12 to the UP signal output terminal, and td3 refers to a delay time taken from the input of the reset signal RST to the UP signal output terminal. As for td3, td6 refers to a delay time taken from the input of the reset signal to the UP signal output terminal, but a rising edge and a falling edge are converse.

td4 refers to a pulse width for preventing dead zone, which is determined by a delay time of the logic gate 30 located in the reset path. In FIG. 7, about 3 periods of phase is compared, in which operation at the rising edge of the second clock CLKref is different from that in FIG. 3. For this portion, a phase difference between the reference clock CLKref and the outer clock CLKout exists in range of 2π−Δ<ΔΦ<2π−δ, in which a missing edge does not occur and the UP signal becomes high earlier than the DOWN signal, in the same manner shown; in FIG. 5. In the third period with ΔΦ≧2π−δ, the DOWN signal becomes high first.

Figure 4:
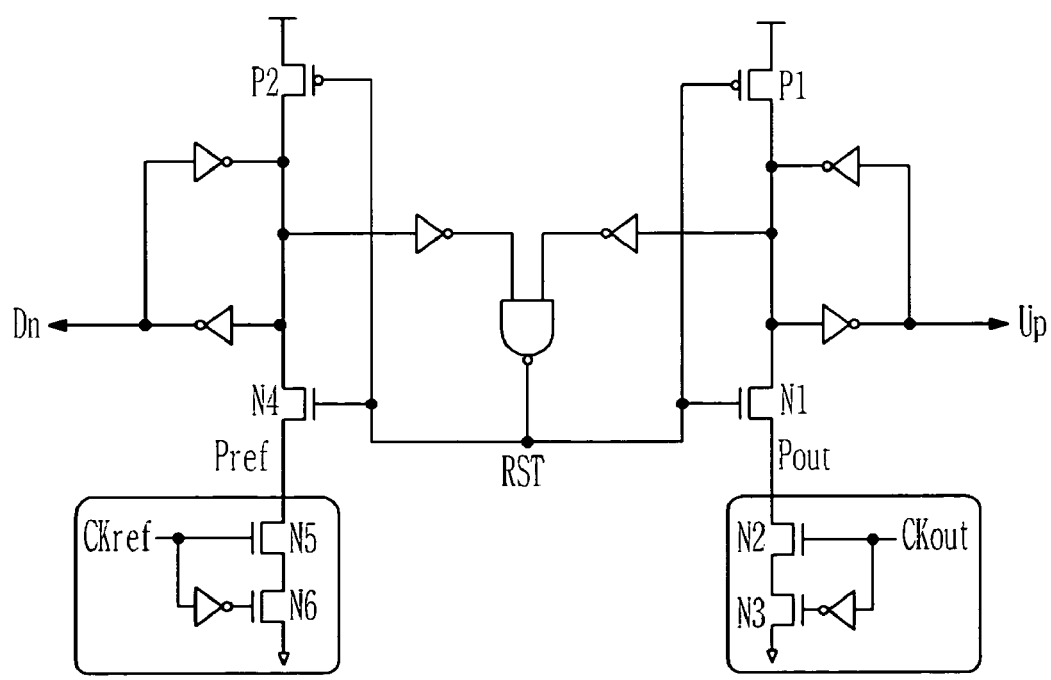
FIG. 4 is a circuit diagram showing another example of the conventional phase frequency detector.

Assuming that the loads connected to the UP and DOWN signal output terminals have the same amplitude and the same rising and falling edges, the PFD of the present invention shown in FIG. 7 has smaller power consumption compared to the conventional PFD shown in FIG. 4. In case of the conventional PFD shown in FIG. 4, in order to change a state of a latch, current driving capability of the transistors P1 and P2 and current driving capabilities of the transistors N1, N2, N3 or N3, N4, N5 connected in series should be larger than that of a positive feedback of the latch. Therefore, since the channel width of the transistor should be much larger than that shown in FIG. 7, more power is consumed to drive the PFD of FIG. 4 at the same operating frequency.

Since the PFD of the present invention arranged in FIG. 6 includes a dynamic logic, there is little room that jitter occurs. In FIG. 7, the phase difference is indicated by a duration difference between the UP signal and the DOWN signal. A variation of the td2 difference and a variation of the td6 difference for the UP signal output unit 10 and the DOWN signal output unit 20 are indicated by a jitter, so that when the PFD of the present invention is applied, the noise characteristic of the PLL is improved.

The delay time td2 taken from the input of the reference clock CLKref and the UP signal output is equal to a sum of a time for the transistor Mn12 to discharge precharged charges in the input stage of the inverter I1 and a delay time of one inverter. Therefore, the delay time td2 is extremely short so that it may be differ from a delay time taken from the input of the outer clock CLKout to the DOWN signal output. In addition, the delay time td6 taken from the input of the reset signal RST to the UP signal output is equal to a sum of a time for the transistor Mn11 to discharge precharged charges in the gate of the transistor Mp13 and Mn13 and a time for the transistor Mp13 to precharge the gate of the inverter I1. The delay time td6 is also extremely short so that it may be differ from a delay time taken from the input of the reset clock RST to the DOWN signal output.

However, for the conventional PFD shown in FIG. 4, the path from the input to the output is longer and the state change speed of the latch is slower than that for a case where the charges of the precharged gate are discharged. Therefore, it will have a longer delay time and there is more chance that the jitter occurs.

A cutoff frequency of the PFD arranged as shown in FIG. 6 is equal to td5*fclk*2π<π when a duty ratio of two input clocks is 50%. This is the same cutoff frequency as that for the general PFD having a characteristic shown in FIG. 3, but smaller than that for the PFD shown in FIG. 4. However, the PFD of FIG. 6 can operate at a higher frequency, as the duty ratio becomes larger. Since reference clock CLKref typically has a duty ratio of 50%, a sign of the outer clock CLKout should be adjusted such that the rising edge has a higher duty ratio to ensure the operation at the maximum frequency when used in the PLL. When the reset time is about 300 ps, td5 is about 500 ps and the cutoff frequency fclk is about 1 GHz. However, since the PFD of FIG. 6 has the same characteristic as that shown in FIG. 5, it is possible to have a fast phase acquisition and low power consumption and low noise characteristics. Therefore, it is suitable when the input frequency is less than 1 GHz.

Figure 8:
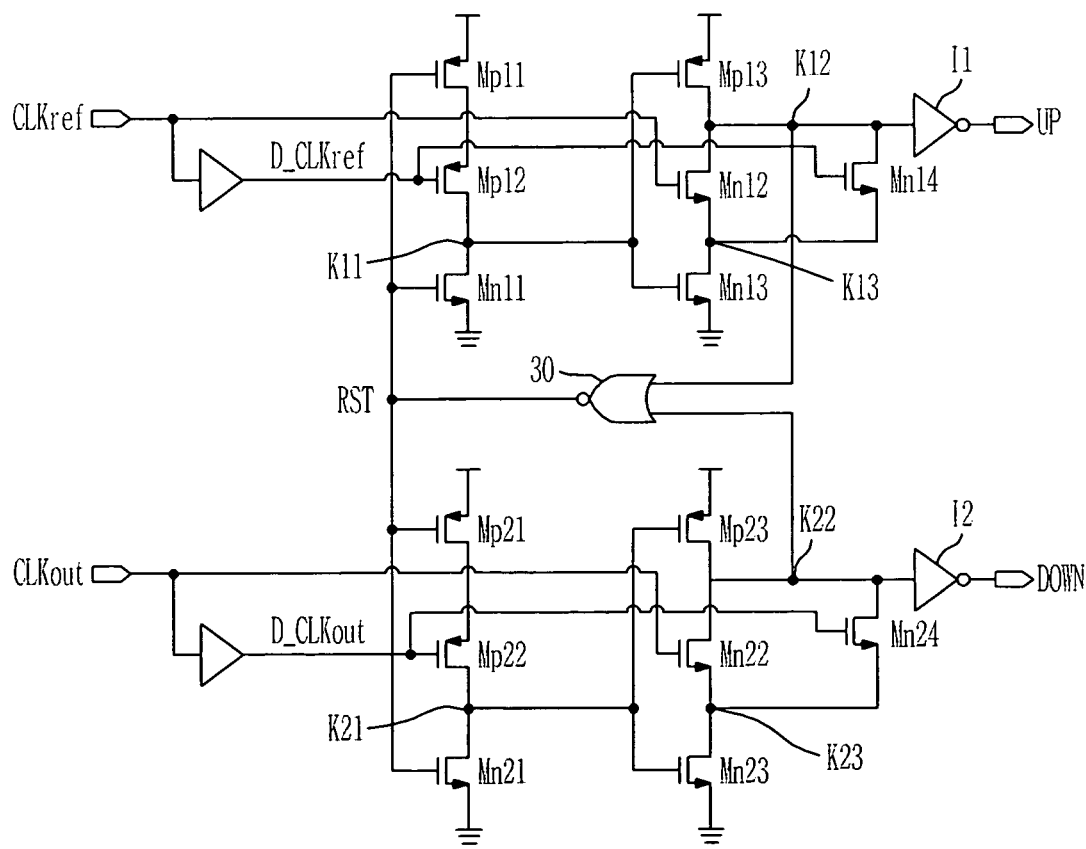
FIG. 8 is a circuit diagram for explaining a phase frequency detector according to a second embodiment of the present invention.

FIG. 8 is a circuit diagram for explaining a phase frequency detector according to a second embodiment of the present invention, where transistors Mn14 and Mn24 are added to the phase frequency detector of FIG. 6.

The transistor Mn14 connected between the output node K12 and a node K13 receives the delayed reference clock D_CLKref through a gate, and the transistor Mn24 connected between the output node K22 and a node K23 receives the delayed outer clock D_CLKout through a gate.

The PFD according to the present embodiment has the same operation characteristic as that of FIG. 5, and the cutoff frequency becomes td5*fclk*2π<π, which is different from that for the PFD of FIG. 6. Therefore, the cutoff frequency is twice higher than that for the PFD of FIG. 6. This is the same cutoff frequency as that for the conventional PFD arranged as shown in FIG. 4.

The PFD according to the present invention has almost the same power consumption and noise characteristic as the PFD of FIG. 6, so that it has a better performance than the PFD of FIG. 4. However, since the PFD of FIG. 8 has two more transistors Mn14 and Mn24 that the PFD of FIG. 6, the PFD of FIG. 8 is preferably operated at a high frequency where the PFD of FIG. 6 is difficult to be operated.

As described above, a phase frequency detector of the present invention uses a dynamic logic and a delay circuit so that the effective control signal can be output even when a phase difference between two clock signals is significantly close to 360 degrees. Therefore, a phase range of the input signal with which the effective control signal can be obtained is wide so that high frequency operation is available and a low power consumption and a low noise characteristic can be achieved due to a fast phase lock, a low power consumption of the dynamic logic, and a fast signal transmission.

As described above, exemplary embodiments of the present invention have been described with reference to the detailed description and the drawings. Terms are used for illustration only, and should not be construed to limit the scope of the present invention described in the claims. Therefore, those skilled in the art will appreciate that a variety of modifications and equivalents thereto can be made. Accordingly, the scope of the present invention will be defined to the subject matter of the following claims.

What is claimed is:

1. A phase frequency detector comprising:
   an UP signal output unit having a first stage operated according to a reference clock delayed by a predetermined time and a reset signal, a second stage operated according to the reference clock and an output of the first stage, and an inverter for inverting an output of the second stage;

a DOWN signal output unit having: a first stage operated according to an outer clock delayed by a predetermined time and the reset signal, a second stage operated according to the outer clock and an output of the first stage, and an inverter for inverting an output of the second stage; and a logic gate logically combining the output of the second stage of the UP signal output unit and the output of the second stage of the DOWN signal output unit to generate the reset signal.

2. The phase frequency detector according to claim 1, wherein the first stage of the UP signal output unit comprises:

first and second transistors connected in series between a power supply voltage and an output node; and a third transistor connected between the output node and the ground, wherein the reset signal is input to gates of the first and third transistors, and the delayed reference clock is input to a gate of the second transistor.

3. The phase frequency detector according to claim 1, wherein the second stage of the UP signal output unit comprises:

a first transistor connected between a power supply voltage and an output node; and second and third transistors connected in series between the output node and the ground, wherein the reference clock is input to a gate of the second transistor, and gates of the first and third transistors are connected to the output node of the first stage.

4. The phase frequency detector according to claim 3, further comprising a fourth transistor connected between the output of the second stage and a connection point of the second transistor and the third transistor, and operated according to the delayed reference clock.

5. The phase frequency detector according to claim 1, wherein the first stage of the DOWN signal output unit comprises:

first and second transistors connected in series between a power supply voltage and an output node; and a third transistor connected between the output node and the ground, wherein the reset signal is input to gates of the first and third transistors, and the delayed outer clock is input to a gate of the second transistor.

6. The phase frequency detector according to claim 1, wherein the second stage of the DOWN signal output unit comprises:

a first transistor connected between a power supply voltage and an output node; and second and third transistors connected in series between the output node and the ground, wherein the outer clock is input to a gate of the second transistor, and gates of the first and third transistors are connected to the output node of the first stage.

7. The phase frequency detector according to claim 6, further comprising a fourth transistor connected between the output of the second stage and a connection point of the second transistor and the third transistor, and operated according to the delayed outer clock.

8. The phase frequency detector according to claim 1, wherein the delayed reference clock and the delayed outer clock are delayed through delay means, respectively.

9. The phase frequency detector according to claim 1, wherein the predetermined time is set to be shorter than a time from a rising edge of a later input clock between the reference clock and the outer clock to a falling edge of the reset signal.

* * * * *

(12) EX PARTE REEXAMINATION CERTIFICATE (7610th)
United States Patent
Tak et al.

(10) Number: US 7,053,666 C1
(45) Certificate Issued: Jul. 13, 2010

(54) PHASE FREQUENCY DETECTOR

(75) Inventors: Geum-Young Tak, Seoul (KR);
Seok-Bong Hyun, Daejeon (KR);
Kyung-Hwan Park, Daejeon-shi (KR);
Tae-Young Kang, Incheon-shi (KR);
Seong-Su Park, Daejeon-shi (KR)

(73) Assignee: Electronics and Telecommunications Research Institute, Yuseong-Gu Daejeon-Shi (KR)

Reexamination Request:
No. 90/008,110, Jul. 7, 2006

Reexamination Certificate for:
Patent No.: 7,053,666
Issued: May 30, 2006
Appl. No.: 11/023,379
Filed: Dec. 29, 2004

(30) Foreign Application Priority Data

Nov. 9, 2004 (KR) .................... 10-2004-0090672

(51) Int. Cl.
*G01R 25/00* (2006.01)
*H03D 13/00* (2006.01)

(52) U.S. Cl. .............................. 327/3; 327/12
(58) Field of Classification Search ............ 327/3, 327/100
See application file for complete search history.

(56) References Cited

FOREIGN PATENT DOCUMENTS

| KR | 1020000005362 | 1/2000 |
|----|---------------|--------|
| WO | 97/39530 | 10/1997 |

*Primary Examiner*—Matthew Heneghan

(57) ABSTRACT

Provided is a phase frequency detector for use in a phase locked loop (PLL) or a delay locked loop (DLL), the phase frequency detector including: an UP signal output unit having a first stage operated according to a reference clock delayed by a predetermined time and a reset signal, a second stage operated according to the reference clock and an output of the first stage, and an inverter for inverting an output of the second stage; a DOWN signal output unit having: a first stage operated according to an outer clock delayed by a predetermined time and the reset signal, a second stage operated according to the outer clock and an output of the first stage, and an inverter for inverting an output of the second stage; and a logic gate logically combining the output of the second stage of the UP signal output unit and the output of the second stage of the DOWN signal output unit to generate the reset signal, thereby a phase range of the input signal with which an effective control signal can be obtained is wide so that low power consumption and low noise characteristics can be obtained due to fast phase lock, low power consumption of a dynamic logic, and fast signal transmission.

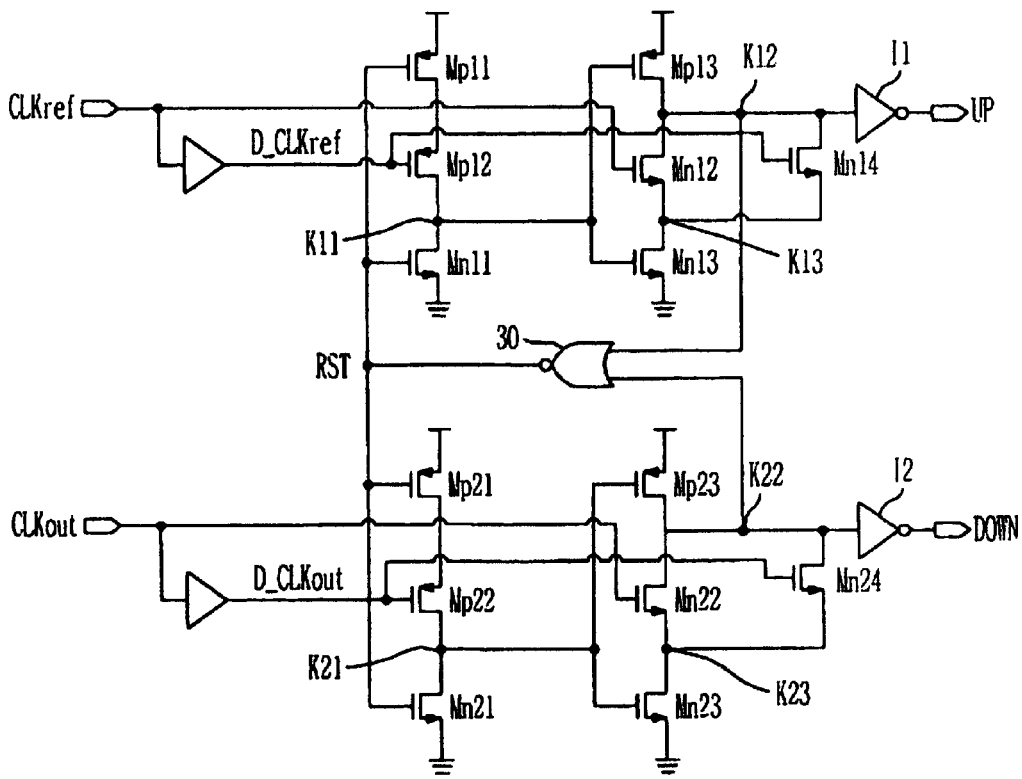

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 8 and 9 are cancelled.

Claim 1 is determined to be patentable as amended.

Claims 2-7, dependent on an amended claim, are determined to be patentable.

New claims 10 and 11 are added and determined to be patentable.

\* \* \* \* \*